(12) United States Patent
Kim et al.

(10) Patent No.: US 8,703,592 B2
(45) Date of Patent: Apr. 22, 2014

(54) METHODS OF FORMING SEMICONDUCTOR DEVICES HAVING FACETED SEMICONDUCTOR PATTERNS

(75) Inventors: Myung-Sun Kim, Hwaseong-si (KR);
Dong-Suk Shin, Yongin-si (KR);
Dong-Hyuk Kim, Seongnam-si (KR);
Yong-Joo Lee, Hwaseong-si (KR);
Hoi-Sung Chung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 423 days.

(21) Appl. No.: 13/052,460

(22) Filed: Mar. 21, 2011

(65) Prior Publication Data
US 2011/0230027 A1 Sep. 22, 2011

(30) Foreign Application Priority Data
Mar. 19, 2010 (KR) .................. 10-2010-0024789

(51) Int. Cl.
*H01L 21/425* (2006.01)

(52) U.S. Cl.
USPC ............................ 438/525; 438/526; 438/546

(58) Field of Classification Search
USPC ......... 438/229, 230, 231, 289, 299, 300, 301, 438/302, 303, 305, 306, 700, 701, 525, 438/546; 257/E21.12, E21.443, E21.618
See application file for complete search history.

(56) References Cited

U.S. PATENT DOCUMENTS

| | | | |
|---|---|---|---|
| 4,549,926 A | 10/1985 | Corboy, Jr. et al. | |
| 4,578,142 A | 3/1986 | Corboy, Jr. et al. | |
| 4,578,143 A | 3/1986 | Arai | |
| 4,592,792 A | 6/1986 | Corboy, Jr. et al. | |
| 4,698,316 A | 10/1987 | Corboy, Jr. et al. | |
| 4,838,993 A | 6/1989 | Aoki et al. | |
| 5,635,746 A | 6/1997 | Kimura et al. | |
| 5,733,792 A * | 3/1998 | Masuoka .................. | 438/302 |
| 5,739,573 A | 4/1998 | Kawaguchi | |
| 5,899,752 A | 5/1999 | Hey et al. | |
| 6,190,453 B1 | 2/2001 | Boydston et al. | |
| 6,190,976 B1 * | 2/2001 | Shishiguchi et al. ......... | 438/299 |
| 6,290,774 B1 | 9/2001 | Solomon et al. | |
| 6,346,732 B1 | 2/2002 | Mizushima et al. | |
| 6,391,749 B1 | 5/2002 | Park et al. | |
| 6,429,084 B1 | 8/2002 | Park et al. | |
| 6,489,206 B2 * | 12/2002 | Chen et al. .................... | 438/300 |
| 6,605,498 B1 | 8/2003 | Murthy et al. | |
| 6,777,759 B1 | 8/2004 | Chau et al. | |
| 6,852,600 B1 | 2/2005 | Wang et al. | |

(Continued)

FOREIGN PATENT DOCUMENTS

| | | |
|---|---|---|
| JP | 61-265814 | 11/1986 |
| JP | 03-050191 | 3/1991 |

(Continued)

*Primary Examiner* — Colleen Matthews
*Assistant Examiner* — Quovaunda V Jefferson
(74) *Attorney, Agent, or Firm* — Myers Bigel Sibley & Sajovec PA

(57) ABSTRACT

Provided are methods of forming semiconductor devices. A method may include preparing a semiconductor substrate including a first region and a second region adjacent the first region. The method may also include forming sacrificial pattern covering the second region and exposing the first region. The method may further include forming a capping layer including a faceted sidewall on the first region using selective epitaxial growth (SEG). The faceted sidewall may be separate from the sacrificial pattern. The sacrificial pattern may be removed. Impurity ions may be implanted into the semiconductor substrate.

19 Claims, 16 Drawing Sheets

(56) References Cited

U.S. PATENT DOCUMENTS

| | | |
|---|---|---|
| 6,998,305 B2 | 2/2006 | Arena et al. |
| 7,361,563 B2 | 4/2008 | Shin et al. |
| 7,517,775 B2 | 4/2009 | Kim et al. |
| 7,572,715 B2 | 8/2009 | Kim et al. |
| 7,611,973 B2 | 11/2009 | Shin et al. |
| 2002/0034864 A1 | 3/2002 | Mizushima et al. |
| 2002/0157688 A1 | 10/2002 | Joo |
| 2002/0192930 A1 | 12/2002 | Rhee et al. |
| 2004/0045499 A1 | 3/2004 | Langdo et al. |
| 2004/0129982 A1 | 7/2004 | Oda et al. |
| 2004/0171238 A1 | 9/2004 | Arena et al. |
| 2005/0040472 A1 | 2/2005 | Oh et al. |
| 2005/0176204 A1 | 8/2005 | Langdo et al. |
| 2005/0263795 A1 | 12/2005 | Choi et al. |
| 2005/0279997 A1 | 12/2005 | Shin et al. |
| 2006/0073679 A1 | 4/2006 | Airaksinen et al. |
| 2006/0088968 A1 | 4/2006 | Shin et al. |
| 2006/0131656 A1 | 6/2006 | Shin et al. |
| 2006/0156970 A1 | 7/2006 | Dong-suk et al. |
| 2006/0202278 A1 | 9/2006 | Shima et al. |
| 2006/0234488 A1 | 10/2006 | Kim et al. |
| 2006/0258125 A1 | 11/2006 | Langdo et al. |
| 2007/0010093 A1 | 1/2007 | Wang et al. |
| 2007/0048907 A1 | 3/2007 | Lee et al. |
| 2007/0131159 A1 | 6/2007 | Kim et al. |
| 2007/0134879 A1 | 6/2007 | Kim et al. |
| 2007/0148835 A1 | 6/2007 | Shima et al. |
| 2007/0148919 A1 | 6/2007 | Lin et al. |
| 2007/0202669 A1 | 8/2007 | Fukuda et al. |
| 2008/0157091 A1* | 7/2008 | Shin et al. ............ 257/66 |
| 2009/0108290 A1 | 4/2009 | Yu et al. |
| 2009/0140351 A1 | 6/2009 | Lin et al. |
| 2009/0246922 A1* | 10/2009 | Wu et al. ............ 438/231 |

FOREIGN PATENT DOCUMENTS

| | | |
|---|---|---|
| JP | 03-050771 | 3/1991 |
| JP | 07-161991 | 6/1995 |
| JP | 2004-095639 | 3/2004 |
| JP | 2005-228761 | 8/2005 |
| KR | 1020000032858 | 6/2000 |
| KR | 1020000055596 | 9/2000 |
| KR | 1020010036270 | 5/2001 |
| KR | 1020020013197 | 2/2002 |
| KR | 1020020028488 | 4/2002 |
| KR | 1020050010252 | 1/2005 |
| KR | 1020050119991 | 12/2005 |

* cited by examiner

METHODS OF FORMING SEMICONDUCTOR DEVICES HAVING FACETED SEMICONDUCTOR PATTERNS

CROSS-REFERENCE TO RELATED APPLICATION

This U.S. non-provisional patent application claims priority under 35 U.S.C. §119 to Korean Patent Application No. 10-2010-0024789, filed on Mar. 19, 2010, the disclosure of which is hereby incorporated by reference in its entirety.

BACKGROUND

1. Field

The present disclosure herein relates to methods of forming semiconductor devices, and more particularly, to methods of forming semiconductor devices having faceted semiconductor patterns.

2. Description of Related Art

Although research has been conducted regarding various ways to improve electrical characteristics of transistors, fabrication of p-channel metal-oxide-semiconductor (PMOS) transistors may face several obstacles with regard to controlling locations of source and drain regions and lightly doped drain (LDD) regions.

SUMMARY

The present disclosure provides methods of forming semiconductor devices having excellent electrical characteristics.

Some embodiments provide a method of forming a semiconductor device. In some embodiments, the method may include preparing a semiconductor substrate including a first region and a second region adjacent the first region. In some embodiments, the method may include forming a sacrificial pattern covering the second region and exposing the first region. In some embodiments, the method may include forming a capping layer including a faceted sidewall on the exposed first region using selective epitaxial growth (SEG). The faceted sidewall may be separated from the sacrificial pattern. In some embodiments, the method may also include removing the sacrificial pattern. In some embodiments, the method may further include implanting impurity ions into the semiconductor substrate using an inclined ion implantation process.

In some embodiments, the faceted sidewall may be formed to an angle of intersection of about 50 to about 59 degrees with a main surface of the semiconductor substrate that is substantially coplanar with a surface of the sacrificial pattern.

In some embodiments, the faceted sidewall may be formed to an angle of intersection of about 51 to about 55 degrees with a main surface of the semiconductor substrate that is substantially coplanar with a surface of the sacrificial pattern.

In some embodiments, the method may further include forming a lightly doped drain (LDD) and a halo in the second region using the inclined ion implantation process at inclinations selected based on the angle of intersection of the faceted sidewall.

In some embodiments, forming the capping layer may include performing a cyclic SEG process at least once, the cyclic SEG process including: supplying a silicon source gas, diborane ($B_2H_6$), hydrogen ($H_2$) and hydrogen chloride (HCl) to the semiconductor substrate and forming a semiconductor layer; supplying $H_2$ to the semiconductor substrate having the semiconductor layer for purging; and supplying a selective etching gas including $H_2$ and HCl to the semiconductor substrate having the semiconductor layer. A number of iterations of the cyclic SEG process may be selected to form the faceted sidewall at a desired angle of intersection with a main surface of the semiconductor substrate that is substantially coplanar with a surface of the sacrificial pattern In some embodiments, the cyclic SEG process may be repeated in response to a comparison of a thickness of a sub-layer of the capping layer with a threshold thickness.

In some embodiments, forming the capping layer may include supplying a silicon source gas, diborane ($B_2H_6$), hydrogen ($H_2$), and hydrogen chloride (HCl) to the semiconductor substrate.

In some embodiments, a method of forming a semiconductor device may include forming a gate electrode on a semiconductor substrate. In some embodiments, the method may also include forming a sacrificial spacer covering a sidewall of the gate electrode. In some embodiments, the method may further include forming a trench in the semiconductor substrate adjacent the gate electrode and the sacrificial spacer. In some embodiments, the method may additionally include forming a recessed source and drain filling the trench. In some embodiments, the method may also include forming a capping layer having a faceted sidewall on the recessed source and drain using selective epitaxial growth (SEG). The faceted sidewall may be separated from the sacrificial spacer and may be between sidewalls of the recessed source and drain. In some embodiments, the method may also include removing the sacrificial spacer. In some embodiments, the method may further include implanting impurity ions into the semiconductor substrate.

In some embodiments, a surface of the recessed source and drain may be formed to extend farther from the semiconductor substrate than a surface of the sacrificial spacer that opposes the semiconductor substrate.

In some embodiments, the recessed source and drain may include silicon germanium (SiGe) layers including boron (B).

In some embodiments, the faceted sidewall may be formed to an angle of intersection of about 50 to about 59 degrees with a main surface of the semiconductor substrate that is substantially coplanar with a surface of the sacrificial spacer.

In some embodiments, the capping layer may include a single crystalline silicon (Si) layer including boron (B).

In some embodiments, forming the capping layer may include performing a cyclic SEG process at least once, the cyclic SEG process including: supplying a silicon source gas, diborane ($B_2H_6$), hydrogen ($H_2$), and hydrogen chloride (HCl) to the semiconductor substrate and forming a semiconductor layer; supplying $H_2$ to the semiconductor substrate having the semiconductor layer for purging; and supplying a selective etching gas including $H_2$ and HCl to the semiconductor substrate having the semiconductor layer.

In some embodiments, a surface of the recessed source and drain may be formed to be substantially coplanar with a surface of the sacrificial spacer.

In some embodiments, implanting the impurity ions into the semiconductor substrate may include forming a lightly doped drain (LDD) in the semiconductor substrate using the gate electrode as an ion implantation mask. In some embodiments, implanting the impurity ions may further include forming a halo in the semiconductor substrate using the gate electrode as an ion implantation mask. The semiconductor substrate may include impurity ions of a first conductivity type. The LDD may include impurity ions of a second conductivity type different from the first conductivity type. The halo may include the first conductivity type impurity ions.

In some embodiments, the method may further include, before forming the trench, implanting the ions of the second conductivity type to form a high concentration impurity region.

In some embodiments, the method may also include forming a metal silicide layer on the capping layer.

In some embodiments, the capping layer may have a smaller width than the recessed source and drain. In some embodiments, the width of the capping layer may be along a direction that is substantially parallel to a surface of the semiconductor substrate.

In some embodiments, a method of forming a semiconductor device may include forming a gate electrode on a semiconductor substrate including a first conductivity type. In some embodiments, the method may include forming a sacrificial spacer on a sidewall of the gate electrode. In some embodiments, the method may also include forming a trench in the semiconductor substrate adjacent the sacrificial spacer by using the sacrificial spacer as an etch mask. In some embodiments, the method may further include forming a semiconductor layer filling the trench. The semiconductor layer may include a second conductivity type. In some embodiments, the method may also include forming a capping layer including a diagonal sidewall on the semiconductor layer using selective epitaxial growth (SEG). The diagonal sidewall may be spaced apart from the sacrificial spacer. In some embodiments, the method may additionally include removing the sacrificial spacer. In some embodiments, the method may also include forming a lightly doped drain (LDD) region on a sidewall of the semiconductor layer by implanting ions of the second conductivity type into the semiconductor substrate using the gate electrode as an ion implantation mask. In some embodiments, the method may further include forming a halo region on the sidewall of the semiconductor layer and between the gate electrode and the capping layer by implanting ions of the first conductivity type into the semiconductor substrate using the gate electrode as an ion implantation mask.

In some embodiments, the method may further include forming an offset spacer on a sidewall of the gate electrode before forming the LDD and the halo. In some embodiments, the offset spacer may be spaced apart from the capping layer.

BRIEF DESCRIPTION OF THE DRAWINGS

The foregoing and other features and advantages of the disclosure will become more apparent by describing in detail exemplary embodiments thereof with reference to the following drawings.

DETAILED DESCRIPTION OF EXAMPLE EMBODIMENTS

Figure 1:
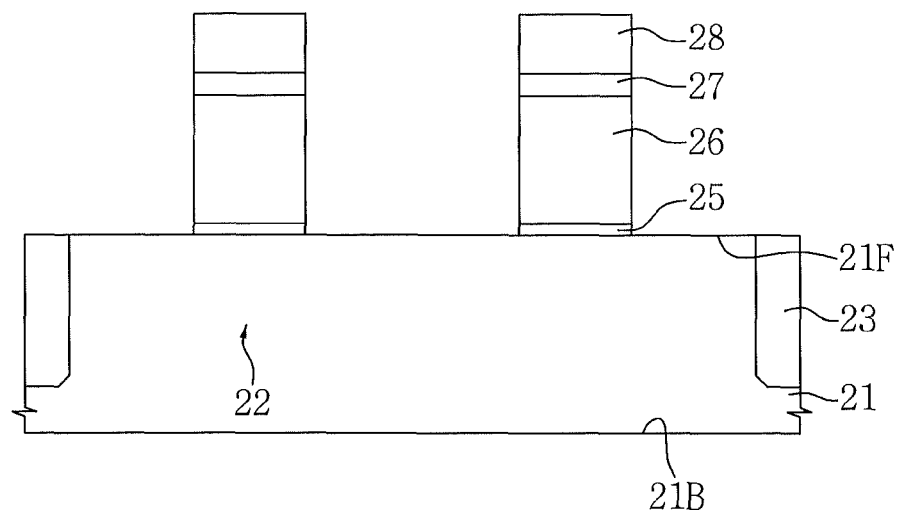
FIGS. 1 through 9 are cross-sectional views illustrating a method of forming a semiconductor device according to some embodiments.

Example embodiments will be described below in more detail with reference to the accompanying drawings. Many different forms and embodiments are possible without deviating from the spirit and teachings of this disclosure and so the disclosure should not be construed as limited to the embodiments set forth herein. Rather, these embodiments are provided so that this disclosure will be thorough and complete, and will fully convey the scope of the disclosure to those skilled in the art. In the drawings, the sizes and relative sizes of layers and regions may be exaggerated for clarity. Like reference numbers refer to like elements throughout.

The terminology used herein is for the purpose of describing particular embodiments only and is not intended to be limiting of the embodiments. As used herein, the singular forms "a", "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Some embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
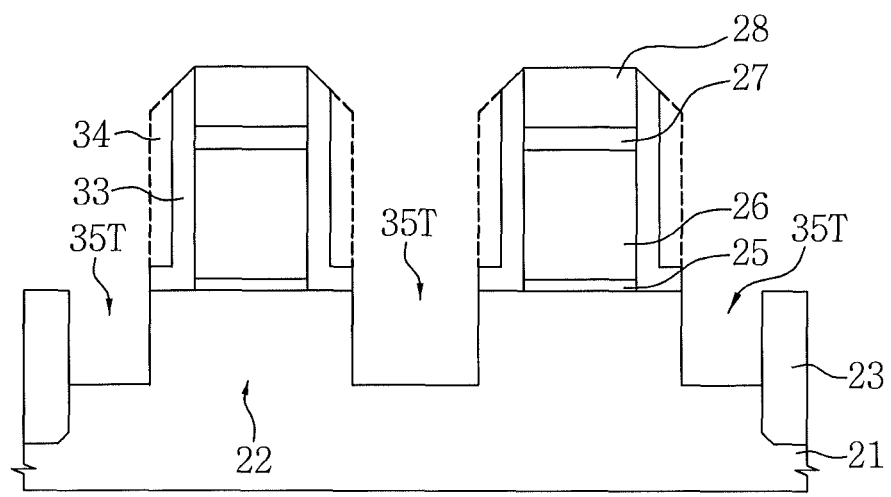
Figure 4:
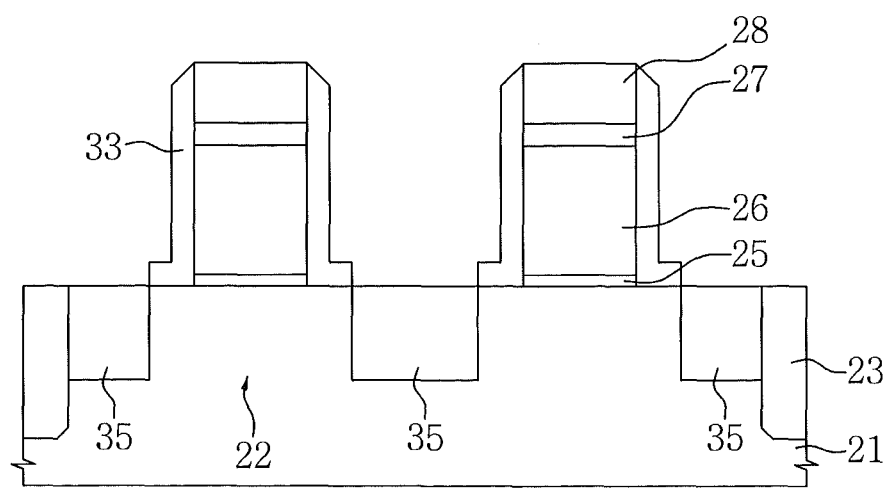
Figure 5:
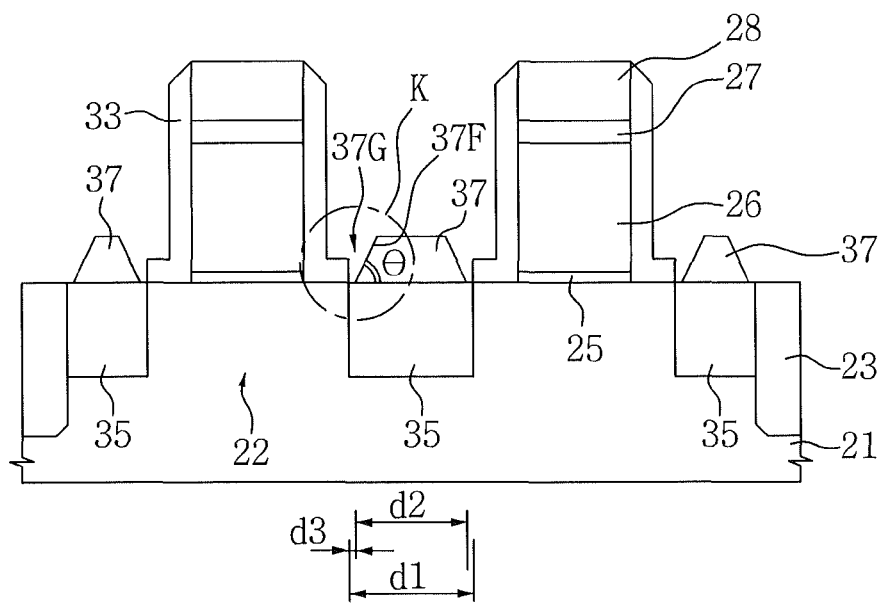
Figure 8:
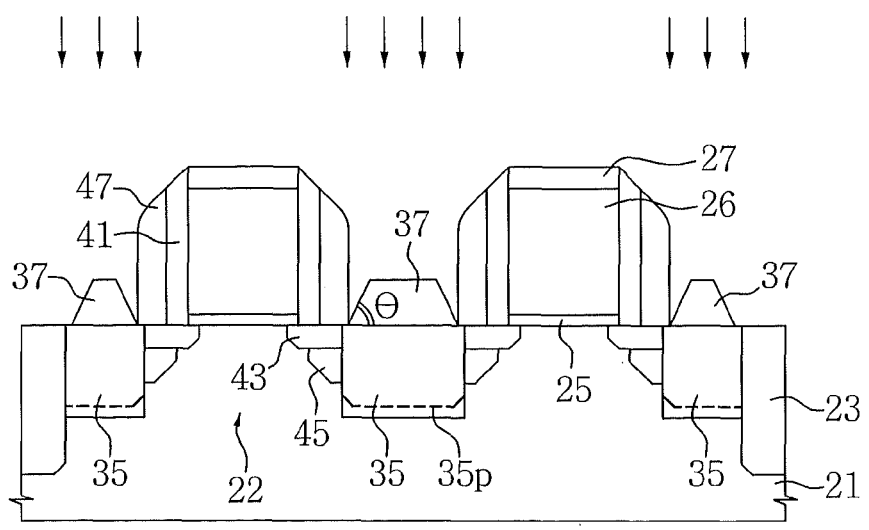
Figure 9:
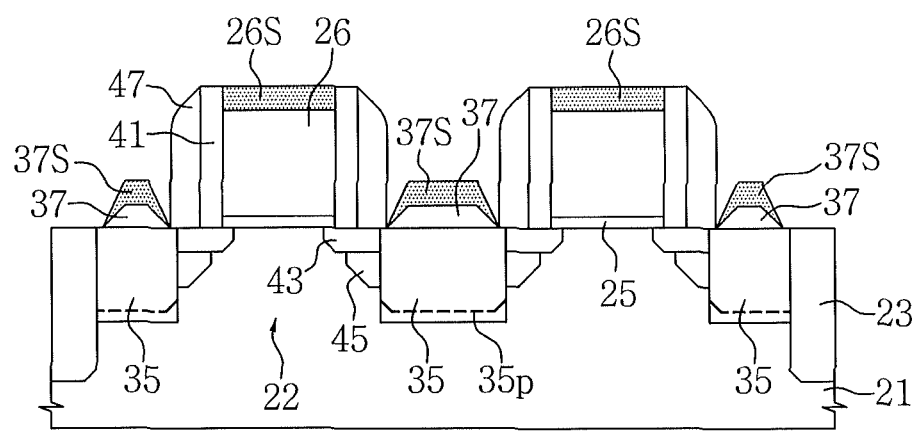
Figure 10:
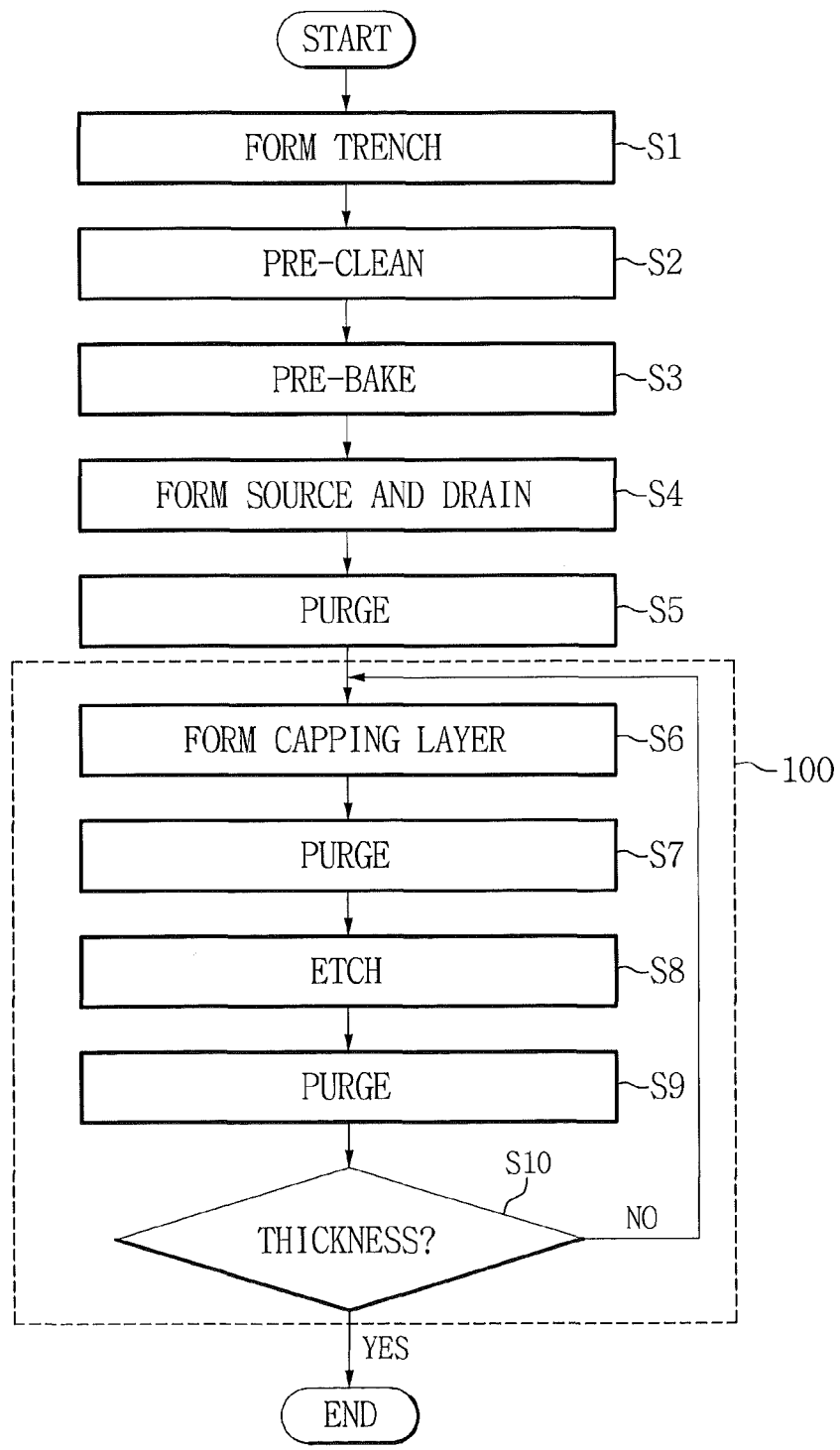
FIGS. 10 and 11 are flowcharts illustrating the method of forming a semiconductor device according to some embodiments.
Figure 11:
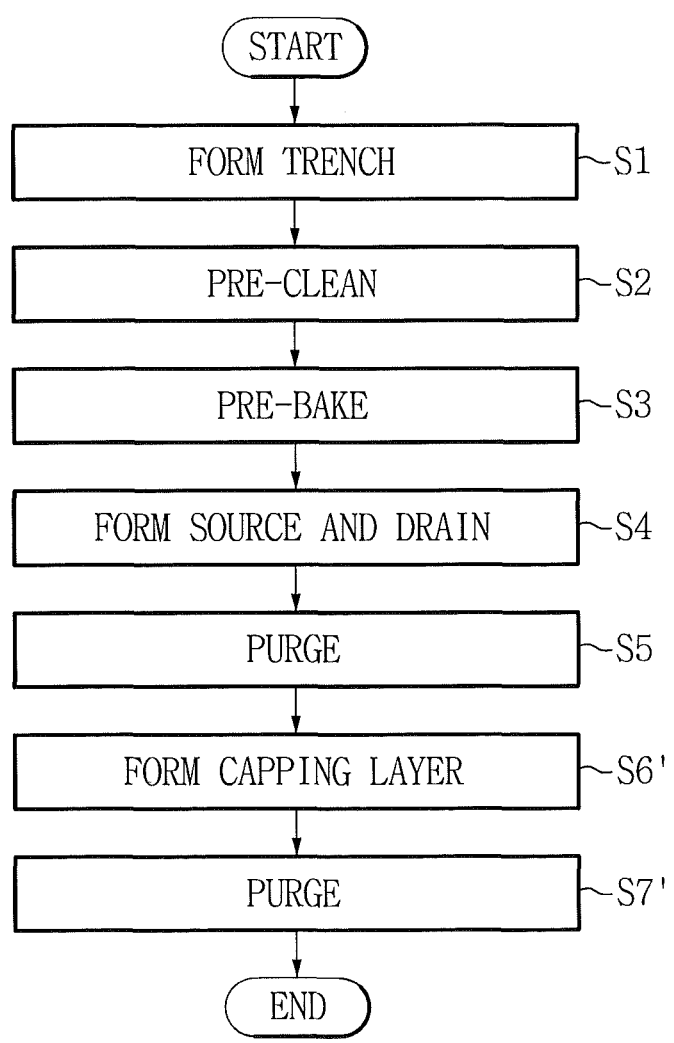

FIGS. 1 through 9 are cross-sectional views illustrating a method of forming a semiconductor device according to some embodiments, FIGS. 10 and 11 are flowcharts illustrating the method of forming a semiconductor device according to some embodiments, and FIGS. 12 through 15 are partially exploded views showing a region K of FIG. 5 in detail.

Referring to FIG. 1, a semiconductor substrate 21 having a front side 21F and a back side 21B may be provided. An isolation layer 23 defining an active region 22 may be formed in the semiconductor substrate 21. A gate electrode 26 and a gate dielectric layer 25 may be formed on the semiconductor substrate 21. The gate electrode 26 and the gate dielectric layer 25 may cross the active region 22. A buffer oxide layer 27 and a mask nitride layer 28 may be on the gate electrode 26.

The semiconductor substrate 21 may be a silicon (Si) wafer having impurity ions of a first conductivity type. The first conductivity type may be an n- or p-type. In this case, the n-type impurity ions may include arsenic (As) or phosphorus (P), and the p-type impurity ions may include boron (B). In some embodiments, the semiconductor substrate 21 may be a silicon wafer having the n-type impurity ions. The front side 21F may be referred to as a main surface. The front side 21F and the back side 21B may be parallel to each other.

The isolation layer 23 may be formed using shallow trench isolation (STI). The isolation layer 23 may be an insulating layer such as a silicon oxide layer, a silicon nitride layer, a silicon oxynitride layer or a combination thereof. The gate dielectric layer 25 may be interposed between the gate electrode 26 and the semiconductor substrate 21. The gate dielectric layer 25 may be formed of a silicon oxide layer, a silicon nitride layer, a silicon oxynitride layer, a high-K dielectric layer, or a combination thereof. The gate electrode 26 may be formed of a polysilicon layer.

The buffer oxide layer 27 and the mask nitride layer 28 may constitute a hard mask pattern. The hard mask pattern may be on the gate electrode 26. The buffer oxide layer 27 may be formed of a silicon oxide layer. The mask nitride layer 28 may be formed of a silicon nitride layer. As shown in FIG. 1, a plurality of spaced-apart gate electrodes 26 may be formed parallel to each other on the semiconductor substrate 21.

Figure 2:
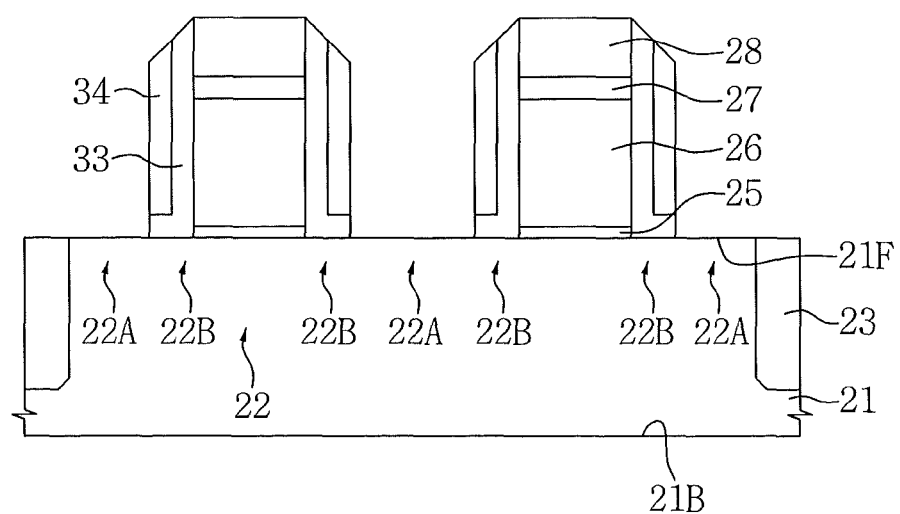

Referring to FIG. 2, a first sacrificial spacer 33 and a second sacrificial spacer 34 covering a sidewall of the gate electrode 26 may be formed. The active region 22 may be divided into a first region 22A and a second region 22B. The first and second regions 22A and 22B may be adjacent each other. The gate electrode 26 and the first and second sacrificial spacers 33 and 34 may cover the second region 22B. The first region 22A, on the other hand, may be exposed.

The first and second sacrificial spacers 33 and 34 may be formed of material layers having different etch selectivities. In some embodiments, the first sacrificial spacer 33 may be formed of a silicon nitride layer, and the second sacrificial spacer 34 may be formed of a silicon oxide layer. The first sacrificial spacer 33 may cover a sidewall of the gate electrode 26 and may cover the second region 22B. In this case, the first sacrificial spacer 33 may be formed in an "L" shape. For example, the first sacrificial spacer 33 may cover portions of the second region 22B between the gate electrode 26 and the first region 22A. The second sacrificial spacer 34 may cover an external sidewall of the first sacrificial spacer 33. A bottom of the second sacrificial spacer 34 may be in contact with the first sacrificial spacer 33. For example, the bottom of the second sacrificial spacer 34 may be in contact with a portion of the first sacrificial spacer 33 that extends from the external sidewall of the first sacrificial spacer 33.

Referring to FIG. 3, a trench 35T may be formed in the semiconductor substrate 21 using the first and second sacrificial spacers 33 and 34, the gate electrode 26, the buffer oxide layer 27, and the mask nitride layer 28 as etch masks.

The trench 35T may be formed using anisotropic etching. The trench 35T may be formed in various shapes having an upper portion narrower or wider than a lower portion. However, the upper and lower portions of the trench 35T may also have substantially the same width as each other.

Subsequently, the semiconductor substrate 21 having the trench 35T may be pre-cleaned. The pre-cleaning may be performed by a wet cleaning process. The second sacrificial spacer 34 may be removed by the pre-cleaning, and the first sacrificial spacer 33 may be conserved on the second region 22B.

Referring to FIG. 4, the semiconductor substrate 21 having the trench 35T may be put into an epitaxial process chamber for pre-baking. The pre-baking may be performed in germane ($GeH_4$) and hydrogen chloride (HCl) atmosphere.

Subsequently, a recessed source and drain 35 filling the trench 35T may be formed using selective epitaxial growth (SEG). The recessed source and drain 35 may be formed of a semiconductor layer including impurity ions of a second conductivity type different from the first conductivity type. When the first conductivity type is an n-type, the second conductivity type may be a p-type, or vice versa. For example, the n-type impurity ions may include As and P, and the p-type impurity ions may include B. In some embodiments, the semiconductor substrate 21 may be a silicon wafer having the n-type impurity ions, and the recessed source and drain 35 may be a semiconductor layer having the p-type impurity ions.

The recessed source and drain 35 may be formed by supplying a silicon source gas, diborane ($B_2H_6$), $GeH_4$, hydrogen ($H_2$), and HCl to the epitaxial process chamber. The silicon source gas may be silicon tetrahydride/silane ($SiH_4$). The recessed source and drain 35 may be formed to be a silicon germanium (SiGe) layer including B. Upper surfaces of the recessed source and drain 35 may be formed at a lower or higher level than the main surface/front side 21F. Alternatively, the upper surfaces of the recessed source and drain 35 may be formed at substantially the same level as the main surface/front side 21F. In other words, the upper surfaces of the recessed source and drain 35 may be substantially coplanar with the main surface/front side 21F.

Referring to FIG. 5, a capping layer 37 may be formed on the recessed source and drain 35 using SEG. The capping layer 37 may include a faceted sidewall 37F. The capping layer 37 may be formed of a semiconductor layer including the second conductivity type impurity ions. The capping layer 37 may be referred to as a faceted semiconductor pattern.

The recessed source and drain 35 may have a first width d1, the capping layer 37 may have a second width d2, and a third width d3 may be formed between the capping layer 37 and the first sacrificial spacer 33. The faceted sidewall 37F may form an angle of intersection (θ) of about 50 to about 59 degrees with the main surface/front side 21F of the semiconductor substrate 21. In some embodiments, the faceted sidewall 37F may form an angle of intersection (θ) of about 51 to about 55 degrees with the main surface/front side 21F of the semiconductor substrate 21.

As a result, the faceted sidewall 37F may be separated from the first sacrificial spacer 33. In addition, the second width d2 may be smaller than the first width d1. Further, the capping layer 37 may be spaced the third width d3 apart from the first sacrificial spacer 33. The capping layer 37 may be formed to have a thickness of 5 to 100 nanometers (nm).

FIGS. 10 through 15 illustrate methods of forming the recessed source and drain 35 and the capping layer 37.

Referring to FIG. 10, a method of forming a semiconductor device according to some embodiments may include formation of a trench 35T (Block S1), pre-cleaning (Block S2), pre-baking (Block S3), formation of a source and a drain (Block S4), purging (Block S5), and a cyclic SEG process 100. The cyclic SEG process 100 may include formation of a capping layer 37 (Block S6), purging (Block S7), etching (Block S8), purging (Block S9), and thickness measurement (Block S10). The pre-baking (Block S3) through the cyclic SEG process 100 may be in-situ processes, which are continuously performed in the same chamber. That is, after the semiconductor substrate 21 is put into the epitaxial process chamber, the pre-baking (Block S3) through the cyclic SEG process 100 may be continuously performed. The cyclic SEG process 100 may be performed once or more to control the thickness of the capping layer 37 and the angle of intersection (θ) of the faceted sidewall 37F.

The formation of the trench 35T (Block S1) and the pre-cleaning (Block S2) may be similar to those described with reference to FIG. 3. The pre-baking (Block S3), the formation of the source and drain (Block S4), and the purging (Block S5) may be similar to those described with reference to FIG. 4. The source and drain may correspond to the recessed source and drain 35. In other words, in some embodiments, the source and drain may be SiGe layers including B. The purging (Block S5) may be performed by supplying $H_2$ to the epitaxial process chamber.

Figure 12:
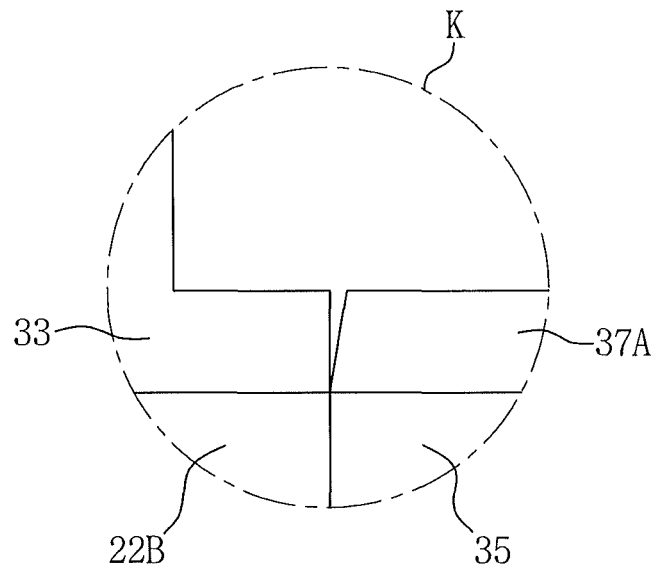
FIGS. 12 through 15 are partially exploded views showing a region K of FIG. 5 in detail.

Referring to FIGS. 10 and 12, the cyclic SEG process 100 may include the formation of the capping layer 37 (Block S6) and the purging (Block S7).

Specifically, in Block S6, the capping layer 37 may be formed by supplying a silicon source gas, $B_2H_6$, $GeH_4$, $H_2$, and HCl to the epitaxial process chamber. The silicon source gas may be $SiH_4$. In Block S6, the capping layer 37 may be performed in the epitaxial process chamber under an inner temperature of 700 to 900° C. As a result, a first capping layer 37A may be selectively grown on the recessed source and drain 35. The first capping layer 37A may be a single crystalline Si layer including B. The purging (Block S7) may be performed by supplying $H_2$ to the epitaxial process chamber.

Figure 13:
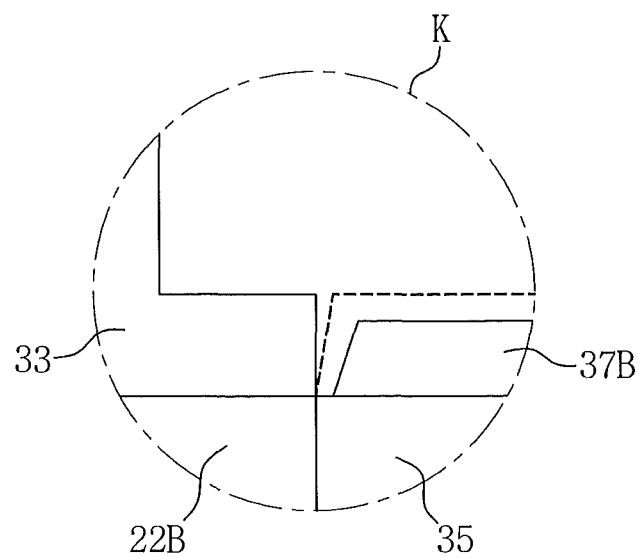

Referring to FIGS. 10 and 13, the etching (Block S8) may be performed by supplying $H_2$ and HCl to the epitaxial process chamber. The purging (Block S9) may be performed by supplying $H_2$ to the epitaxial process chamber. As a result, the first capping layer 37A may be partially etched to form a second capping layer 37B. Accordingly, the second capping layer 37B may be separated from the first sacrificial spacer 33.

Afterward, the thickness of the second capping layer 37B may be measured (Block S10).

Figure 14:
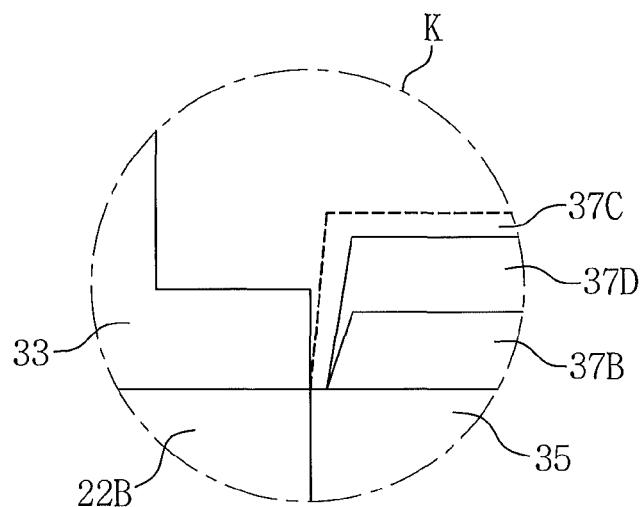

Referring to FIGS. 10 and 14, a third capping layer 37C and a fourth capping layer 37D may be formed by repeating the cyclic SEG process 100. For example, the cyclic SEG process 100 may be repeated in response to a comparison of a measured thickness of the second capping layer 37B with a threshold thickness. The fourth capping layer 37D may be formed by portions of the third capping layer 37C remaining on the second capping layer 37B after the etching (Block S8). The fourth capping layer 37D may be separated from the first sacrificial spacer 33.

Figure 15:
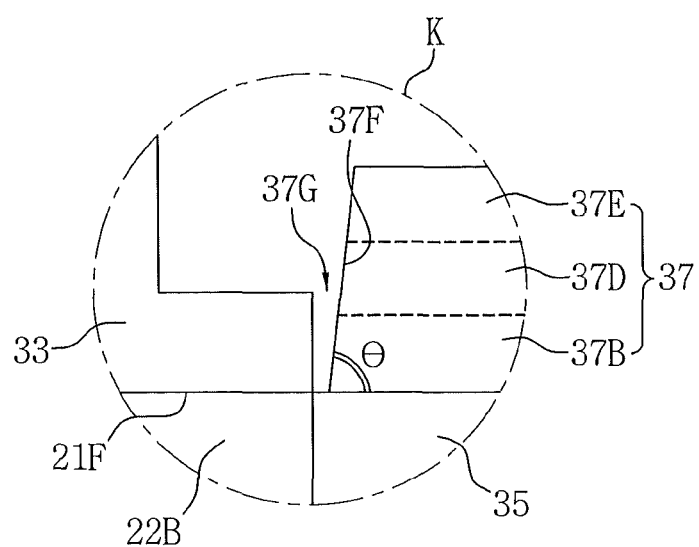

Referring to FIGS. 10 and 15, a fifth capping layer 37E may be formed on the fourth capping layer 37D by repeating the cyclic SEG process 100 again. The fifth capping layer 37E may be separated from the first sacrificial spacer 33. The second capping layer 37B, the fourth capping layer 37D and the fifth capping layer 37E may constitute the capping layer 37. The capping layer 37 may include the faceted sidewall 37F. A gap 37G may be formed between the capping layer 37 and the first sacrificial spacer 33.

The semiconductor substrate 21 may define the front side 21F of FIG. 1 and the back side 21B of FIG. 1. An extension of the front side 21F may be referred to as the main surface. The faceted sidewall 37F may be formed to an angle of intersection (θ) of 51 to 55 degrees with the main surface. For example, the faceted sidewall 37F may be formed to an angle of intersection (θ) of approximately 53 degrees. The angle (θ) of the faceted sidewall 37F may be controlled by the number of iterations of the cyclic SEG process 100.

The capping layer 37 may be a single crystalline Si layer including B. In some other embodiments, the capping layer 37 may be a silicon carbide (SiC) or SiGe layer. An upper surface of the capping layer 37 may be formed at a higher level than the gate dielectric/insulating layer 25.

Referring to FIG. 11, the method of forming a semiconductor device according to some embodiments may include formation of a trench 35T (Block Si), pre-cleaning (Block S2), pre-baking (Block S3), formation of a source and a drain (Block S4), purging (Block S5), formation of a capping layer 37 (Block S6'), and purging (Block S7'). The pre-baking (Block S3) through the purging (Block S7') may be in-situ processes which are continuously performed in the same chamber. That is, after the semiconductor substrate 21 is put into the epitaxial process chamber, the pre-baking (Block S3) through the purging (Block S7') may be continuously performed.

The formation of the trench 35T (Block S1) through the purging (Block S5) may be substantially the same as those described with reference to FIG. 10. The capping layer 37 (Block S6') may be formed by supplying a silicon source gas, $B_2H_6$, $GeH_4$, $H_2$, and HCl to the epitaxial process chamber. The silicon source gas may be $SiH_4$. As a result, the capping layer 37 may be selectively grown on the recessed source and drain 35. The capping layer 37 may be a single-crystalline Si layer including B. The purging (Block S7') may be performed by supplying $H_2$ to the epitaxial process chamber. The capping layer 37 may include the faceted sidewall 37F. A gap 37G may be formed between the capping layer 37 and the first sacrificial spacer 33. The faceted sidewall 37F may be formed to an angle of intersection (θ) of approximately 58 degrees with the main surface.

Figure 6:
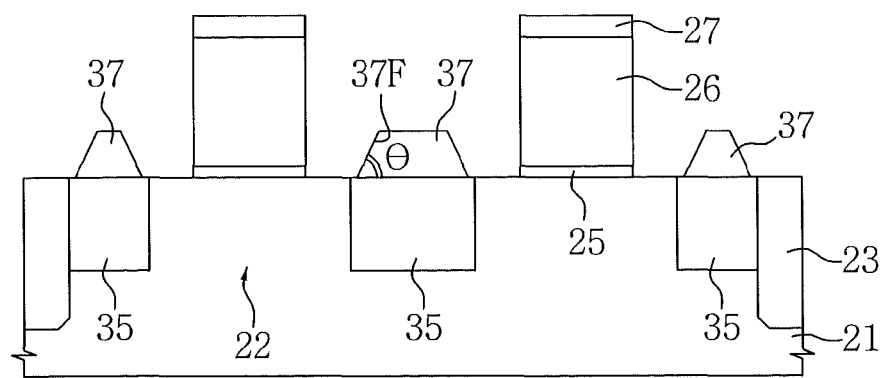

Referring to FIG. 6, the first sacrificial spacer 33 may be removed to expose the active region 22 between the gate electrode 26 and the capping layer 37. To remove the first sacrificial spacer 33, an etching process using phosphoric acid ($H_3PO_4$) may be applied. During the removal of the first sacrificial spacer 33, the mask nitride layer 28 may be also removed. The buffer oxide layer 27 may be conserved on the gate electrode 26. In some embodiments, the buffer oxide layer 27 may be also removed.

Figure 7:
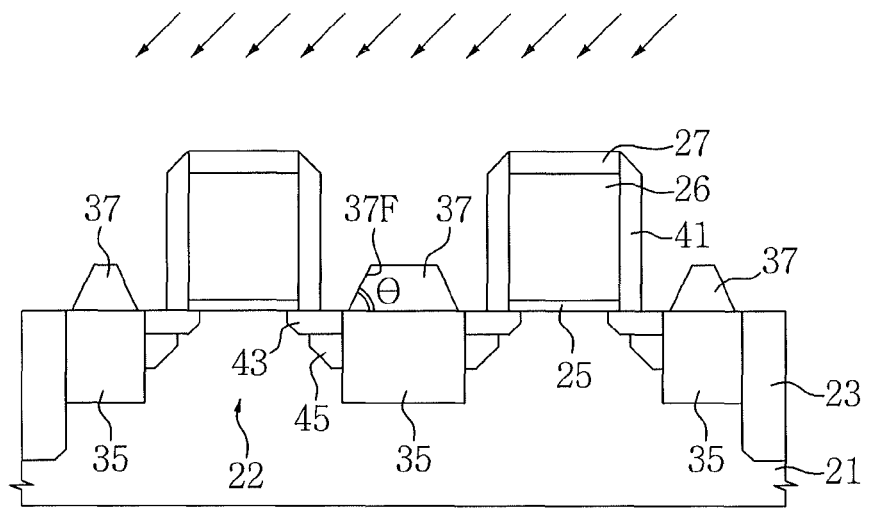

Referring to FIG. 7, a first spacer 41 covering a sidewall of the gate electrode 26 may be formed. The first spacer 41 may be referred to as an offset spacer. The active region 22 may be exposed between the first spacer 41 and the capping layer 37. That is, the first spacer 41 may be formed to be separated from the capping layer 37. A lightly doped drain (LDD) 43 and a "halo" region 45 may be formed in the active region 22.

The first spacer 41 may be formed of an insulating layer such as a silicon oxide layer, a silicon nitride layer, a silicon oxynitride layer, or a combination thereof. The LDD 43 may be formed by implanting the second conductivity type impurity ions into the active region 22 using the first spacer 41 and the gate electrode 26 as ion implantation masks. The halo 45 may be formed by implanting the first conductivity type impurity ions into the active region 22 using the first spacer 41 and the gate electrode 26 as ion implantation masks.

The LDD 43 and the halo 45 may be formed by an inclined ion implantation process using ion implantation energy at various inclinations selected based on the angle ($\theta$) of the faceted sidewall 37F of the capping layer 37. The LDD 43 and the halo 45 may be aligned between the first spacer 41 and the capping layer 37. The halo 45 may be formed at a lower level than the LDD 43. In other words, the LDD 43 may be between the halo 45 and the first spacer 41. In some embodiments, the LDD 43 and/or the halo 45 may be formed before the first spacer 41. The LDD 43 and/or the halo 45 may be aligned between the gate electrode 26 and the capping layer 37.

In some embodiments, due to the angle ($\theta$) of the faceted sidewall 37F, a sufficient margin may be provided to form the LDD 43 and/or the halo 45 between the first spacer 41 and the capping layer 37.

Referring to FIG. 8, a second spacer 47 covering an external sidewall of the first spacer 41 may be formed. A high concentration impurity region 35$p$ may be formed by implanting the second conductivity type impurity ions into the semiconductor substrate 21 using the first spacer 41, the second spacer 47, and the gate electrode 26 as ion implantation masks. The LDD 43 and the halo 45 may be conserved or maintained under the first spacer 41 and the second spacer 47.

The second spacer 47 may be formed of an insulating layer such as a silicon oxide layer, a silicon nitride layer, a silicon oxynitride layer, or a combination thereof. The high concentration impurity region 35$p$ may be formed in the capping layer 37 and the recessed source and drain 35. For example, the high concentration impurity region 35$p$ may be formed to have substantially the same width as the capping layer 37 and the recessed source and drain 35, and the high concentration impurity region 35$p$ may be formed at a higher level than bottom surfaces of the recessed source and drain 35.

In other embodiments, the high concentration impurity region 35$p$ may be formed to have substantially the same depth and width as the capping layer 37 and the recessed source and drain 35, or may be formed to have higher width and depth than the capping layer 37 and the recessed source and drain 35.

Referring to FIG. 9, the buffer oxide layer 27 may be removed to expose the gate electrode 26. A gate metal silicide layer 26S and a drain metal silicide layer 37S may be formed on the gate electrode 26 and the capping layer 37, respectively. The gate metal silicide layer 26S and the drain metal silicide layer 37S may be formed of nickel silicide (NiSi), cobalt silicide (CoSi), titanium silicide (TiSi), or tantalum silicide (TaSi). The drain metal silicide layer 37S may be formed along a surface of the capping layer 37.

In some embodiments, the capping layer 37 may be entirely converted into the drain metal silicide layer 37S. Further, a partial region of the recessed source and drain 35 may be also converted into the drain metal silicide layer 37S.

FIGS. 16 through 20 are cross-sectional views illustrating a method of forming a semiconductor device according to some embodiments.

Figure 16:
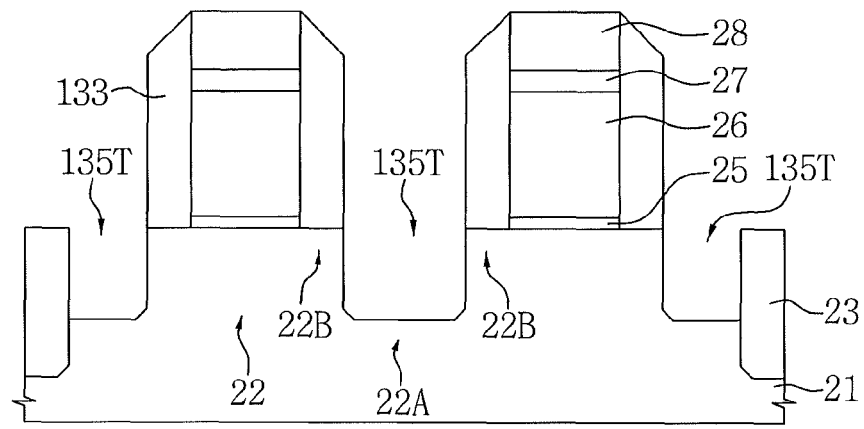
FIGS. 16 through 20 are cross-sectional views illustrating a method of forming a semiconductor device according to some embodiments.

Referring to FIG. 16, an isolation layer 23 defining an active region 22 may be formed in a semiconductor layer 21. A gate electrode 26 and a gate dielectric layer 25 may be formed on the semiconductor layer 21. The gate electrode 26 and the gate dielectric layer 25 may cross the active region 22. A buffer oxide layer 27 and a mask nitride layer 28 may be on the gate electrode 26.

A sacrificial spacer 133 covering a sidewall of the gate electrode 26 may be formed. The active region 22 may be divided into a first region 22A and a second region 22B. The gate electrode 26 and the sacrificial spacer 133 may cover the second region 22B. The sacrificial spacer 133 may be formed of a silicon nitride layer.

A trench 135T may be formed in the semiconductor substrate 21 using the sacrificial spacer 133, the gate electrode 26, the buffer oxide layer 27, and the mask nitride layer 28 as etch masks. Subsequently, the semiconductor substrate 21 having the trench 135T may be pre-cleaned. The pre-cleaning may be performed by a wet cleaning process. The sacrificial spacer 133 may be conserved on the second region 22B.

Figure 17:
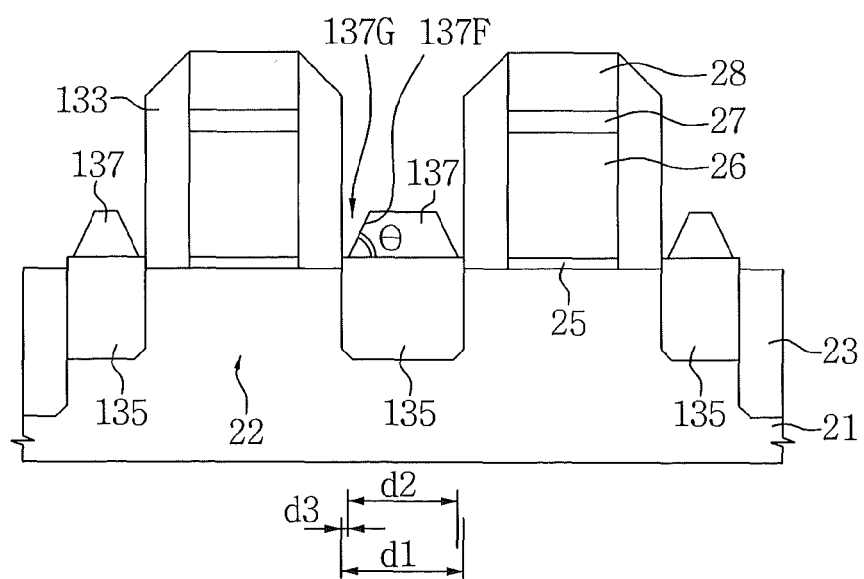

Referring to FIG. 17, the semiconductor substrate 21 having the trench 135T may be put into an epitaxial process chamber for pre-baking. The pre-baking may be performed in $GeH_4$ and HCl atmosphere.

Subsequently, a recessed source and drain 135 filling the trench 135T may be formed using SEG. The recessed source and drain 135 may be formed of a semiconductor layer including impurity ions of a second conductivity type which is different from the first conductivity type. The second conductivity type may be an n- or p-type. In some embodiments, the semiconductor substrate 21 may be a silicon wafer having the n-type impurity ions, and the recessed source and drain 135 may be semiconductor layers having the p-type impurity ions.

The recessed source and drain 135 may be formed by supplying a silicon source gas, $B_2H_6$, $GeH_4$, $H_2$, and HCl to the epitaxial process chamber. The silicon source gas may be $SiH_4$. For example, the recessed source and drain 135 may be a SiGe layer including B. As illustrated in FIG. 17, an upper surface of the recessed source and drain 135 may be formed at a higher level than the main surface of the semiconductor substrate 21.

Afterward, a capping layer 137 may be formed on the recessed source and drain 135 using SEG. The capping layer 137 may be formed by a method similar to that described with reference to FIGS. 10 through 15. The capping layer 137 may include a faceted sidewall 137F. The capping layer 137 may be formed of a semiconductor layer including second conductivity type impurity ions. The capping layer 137 may be referred to as a faceted semiconductor pattern.

The recessed source and drain 135 may have a first width d1, and the capping layer 137 may have a second width d2. A third width d3 may be formed between the capping layer 137 and the sacrificial spacer 133. The faceted sidewall 137F may be formed to an angle of intersection ($\theta$) of about 50 to about 59 degrees with the main surface of the semiconductor substrate 21. In some embodiments, the faceted sidewall 137F may be formed to an angle of intersection (θ) of about 51 to about 55 degrees with the main surface of the semiconductor substrate 21.

As a result, the faceted sidewall 137F may be separated from the sacrificial spacer 133. That is, a gap 137G may be formed between the capping layer 137 and the sacrificial spacer 133. In addition, the second width d2 may be smaller than the first width d1. Furthermore, the capping layer 137 may be formed to be spaced the third width d3 apart from the sacrificial spacer 133. The capping layer 137 may be formed to have a thickness of about 5 to 100 nm.

Figure 18:
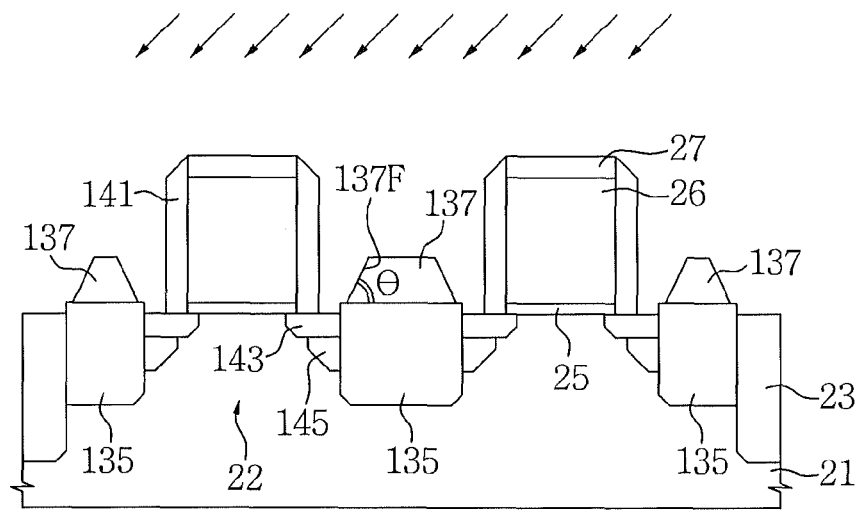

Referring to FIG. 18, the sacrificial spacer 133 may be removed to expose the active region 22 between the gate electrode 26 and the capping layer 137. A first spacer 141 covering a sidewall of the gate electrode 26 may be formed. An LDD 143 and a halo 145 may be formed in the active region 22 using inclined ion implantation.

The LDD 143 may be formed by implanting the second conductivity type impurity ions into the active region 22 using the first spacer 141 and the gate electrode 26 as ion implantation masks. The halo 145 may be formed by implanting the first conductivity type impurity ions into the active region 22 using the first spacer 141 and the gate electrode 26 as ion implantation masks.

According to some embodiments, a sufficient margin may be provided to form the LDD 143 and/or the halo 145 between the first spacer 141 and the capping layer 137 due to the angle (θ) of the faceted sidewall 137F.

Figure 19:
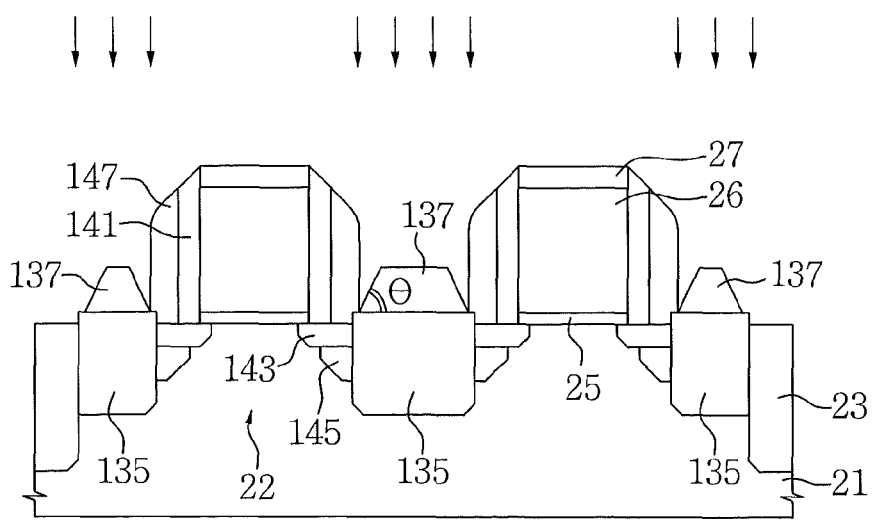

Referring to FIG. 19, a second spacer 147 covering an external sidewall of the first spacer 141 may be formed. A high concentration impurity region may be formed by implanting the second conductivity type impurity ions into the semiconductor substrate 21 using the first spacer 141, the second spacer 147, and the gate electrode 26 as ion implantation masks. The high concentration impurity region may be formed to have substantially the same depth and width as the capping layer 137 and the recessed source and drain 135. The LDD 143 and the halo 145 may be conserved under the first spacer 141 and the second spacer 147.

Figure 20:
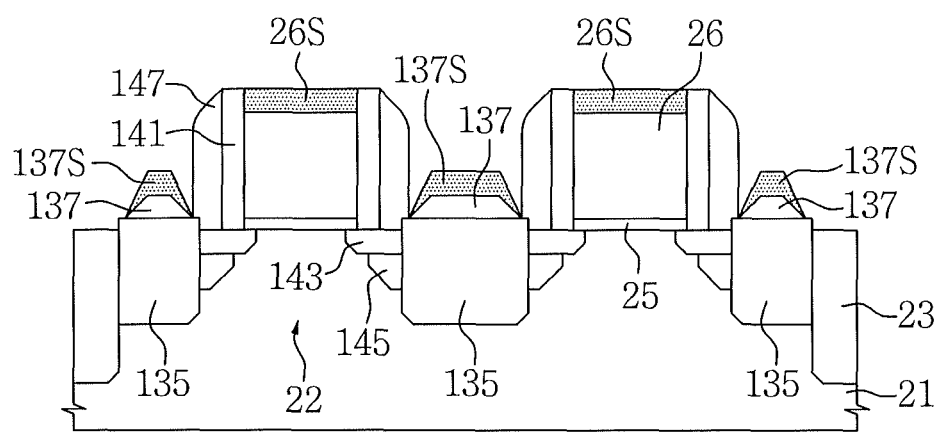

Referring to FIG. 20, the buffer oxide layer 27 may be removed to expose the gate electrode 26. A gate metal silicide layer 26S and a drain metal silicide layer 137S may be formed on the gate electrode 26 and the capping layer 137, respectively. The drain metal silicide layer 137S may be formed along a surface of the capping layer 37.

FIGS. 21 through 24 are cross-sectional views illustrating a method of forming a semiconductor device according to some embodiments.

Figure 21:
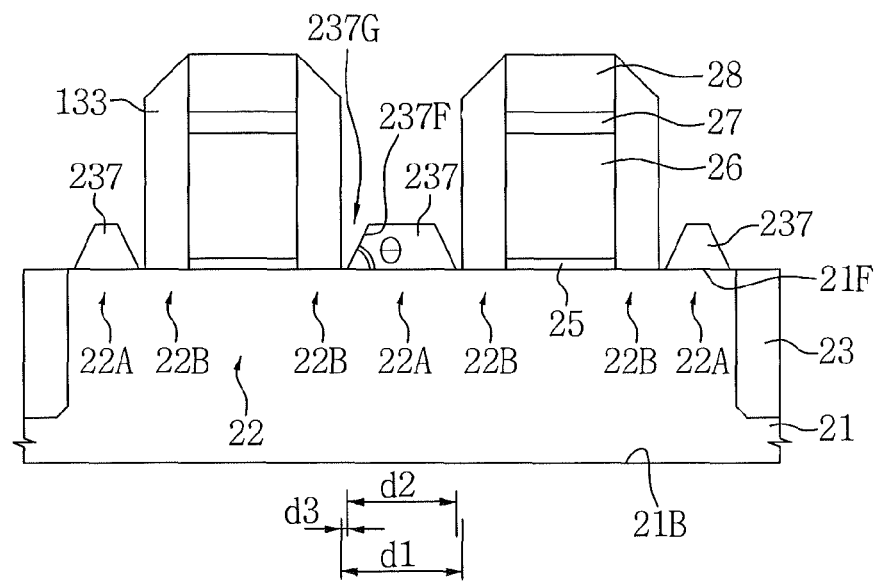
FIGS. 21 through 24 are cross-sectional views illustrating a method of forming a semiconductor device according to some embodiments.

Referring to FIG. 21, a semiconductor substrate 21 having a front side 21F and a back side 21B may be provided. An isolation layer 23 defining an active region 22 may be formed in the semiconductor substrate/layer 21. A gate electrode 26 and a gate dielectric layer 25 may be formed on the semiconductor substrate 21. The gate electrode 26 and the gate dielectric layer 25 may cross the active region 22. A buffer oxide layer 27 and a mask nitride layer 28 may be on the gate electrode 26. A sacrificial spacer 133 covering a sidewall of the gate electrode 26 may be formed. The active region 22 may be divided into a first region 22A and a second region 22B. The gate electrode 26 and the sacrificial spacer 133 may cover the second region 22B.

The semiconductor substrate 21 may be a silicon wafer having impurity ions of a first conductivity type. The first conductivity type may be an n- or p-type. The n-type impurity ions may include As and P, and the p-type impurity ions may include B. The front side 21F may be referred to as a main surface. The front side 21F and the back side 21B may be parallel to each other.

A capping layer 237 may be formed in the first region 22A using SEG. The capping layer 237 maybe formed by a method similar to that described with reference to FIGS. 10 through 15. The capping layer 237 may include a faceted sidewall 237F. The capping layer 237 may be formed of a semiconductor layer including impurity ions of a second conductivity type which is different from the first conductivity type. The capping layer 237 may be referred to as a faceted semiconductor pattern. When the first conductivity type is an n-type, the second conductivity type may be a p-type, or vice versa. In some embodiments, the capping layer 237 may be a single-crystalline Si layer including B.

The first region 22A may include a first width d1, and the capping layer 237 may include a second width d2. A third width d3 may be formed between the capping layer 237 and the sacrificial spacer 133. The faceted sidewall 237F may be formed to an angle of intersection (θ) of about 50 to about 59 degrees with the main surface of the semiconductor substrate 21. In some embodiments, the faceted sidewall 237F may be formed to an angle of intersection (θ) of about 51 to about 55 degrees with the main surface the semiconductor substrate 21.

As a result, the faceted sidewall 237F may be separated from the sacrificial spacer 133. That is, a gap 237G may be formed between the capping layer 237 and the sacrificial spacer 133. In addition, the second width d2 may be smaller than the first width d1. Furthermore, the capping layer 237 may be formed to be spaced the third width d3 apart from the sacrificial spacer 133. The capping layer 237 may be formed to have a thickness of 5 to 100 nm.

Figure 22:
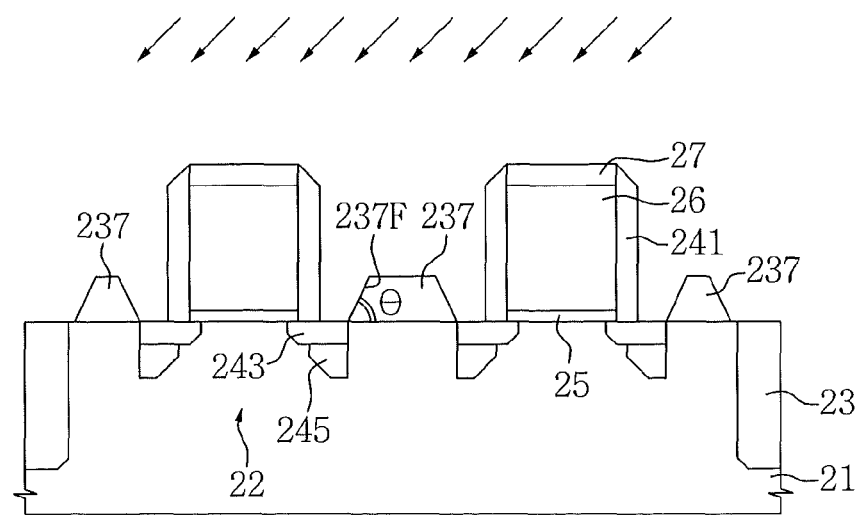

Referring to FIG. 22, the sacrificial spacer 133 may be removed to expose the active region 22 between the gate electrode 26 and the capping layer 237. A first spacer 241 covering a sidewall of the gate electrode 26 may be formed. An LDD 243 and a halo 245 may be formed in the active region 22 using inclined ion implantation.

The LDD 243 may be formed by implanting the second conductivity type impurity ions into the active region 22 using the first spacer 241 and the gate electrode 26 as ion implantation masks. The halo 245 may be formed by implanting the first conductivity type impurity ions into the active region 22 using the first spacer 241 and the gate electrode 26 as ion implantation masks.

According to some embodiments, a sufficient margin may be provided to form the LDD 243 and/or the halo 245 between the first spacer 241 and the capping layer 237 due to the angle (θ) of the faceted sidewall 237F.

Figure 23:
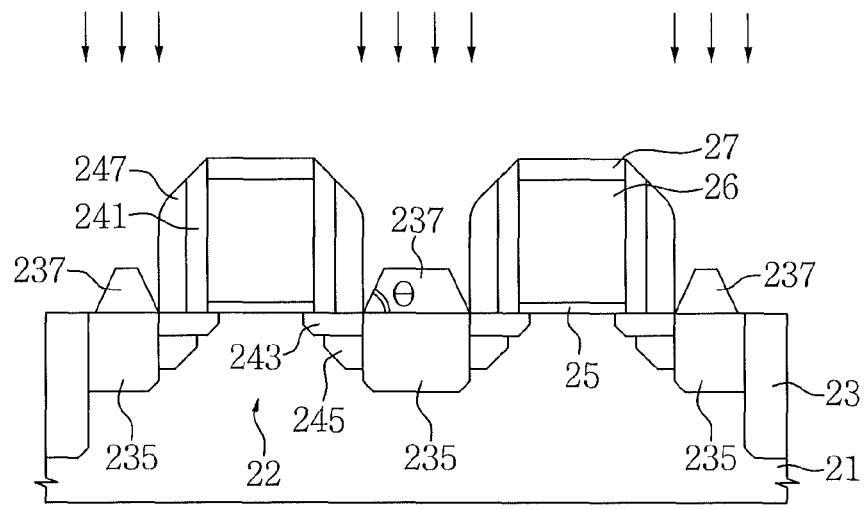

Referring to FIG. 23, a second spacer 247 covering an external sidewall of the first spacer 241 may be formed. A high concentration impurity region may be formed by implanting the second conductivity type impurity ions into the semiconductor substrate 21 using the first spacer 241, the second spacer 247, and the gate electrode 26 as ion implantation masks. The LDD 243 and the halo 245 may be conserved under the first spacer 241 and the second spacer 247.

Figure 24:
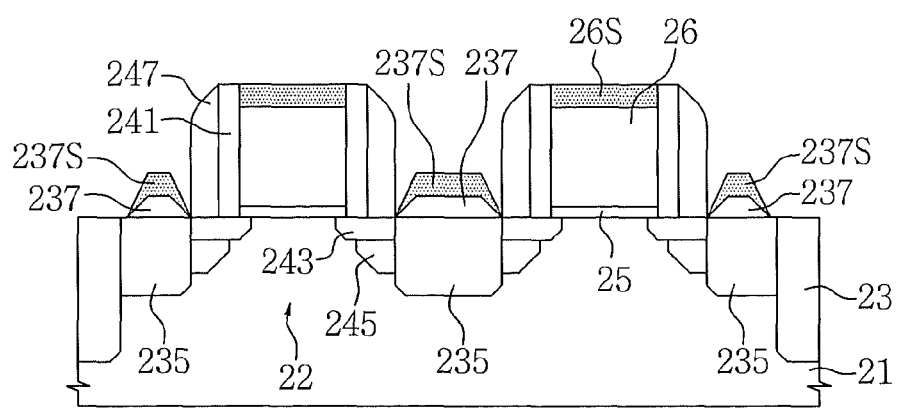

Referring to FIG. 24, the buffer oxide layer 27 may be removed to expose the gate electrode 26. A gate metal silicide layer 26S and a drain metal silicide layer 237S may be formed on the gate electrode 26 and the capping layer 237, respectively. The drain metal silicide layer 237S may be formed along a surface of the capping layer 237.

Figure 25:
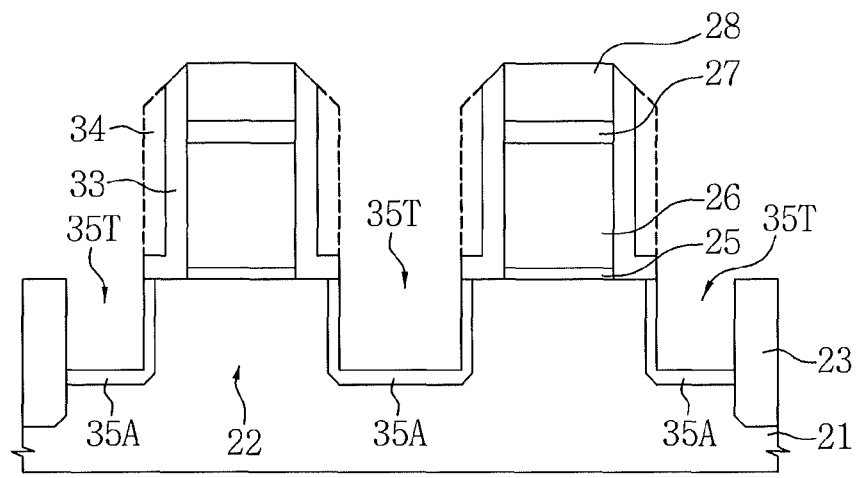
FIGS. 25 and 26 are cross-sectional views illustrating a method of forming a semiconductor device according to some embodiments.
Figure 26:
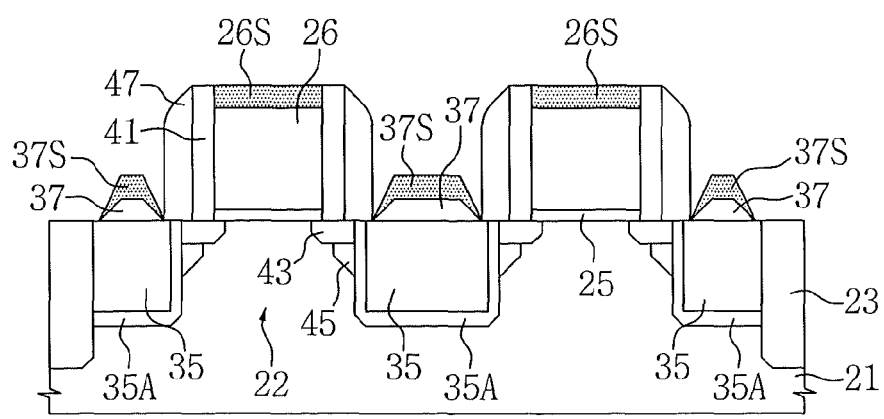

FIGS. 25 and 26 are cross-sectional views illustrating a method of forming a semiconductor device according to some embodiments.

Referring to FIG. 25, an isolation layer 23 defining an active region 22 may be formed in a semiconductor layer 21. A gate electrode 26 and a gate dielectric layer 25 which cross the active region 22 may be formed. A buffer oxide layer 27 and a mask nitride layer 28 may remain on the gate electrode 26. The semiconductor substrate 21 may be a silicon wafer having impurity ions of a first conductivity type.

A first sacrificial spacer 33 and a second sacrificial spacer 34 covering a sidewall of the gate electrode 26 may be formed. A high concentration impurity region 35A may be formed by implanting impurity ions of a second conductivity type into the semiconductor substrate 21 using the first and second sacrificial spacers 33 and 34, the gate electrode 26, the buffer oxide layer 27, and the mask nitride layer 28 as ion implantation masks.

A trench 35T may be formed in the semiconductor substrate 21 using the first and second sacrificial spacers 33 and 34, the gate electrode 26, the buffer oxide layer 27, and the mask nitride layer 28 as etch masks. The high concentration impurity region 35A may be conserved on a bottom and sidewalls of the trench 35T.

Subsequently, the semiconductor substrate 21 having the trench 35T may be pre-cleaned. The pre-cleaning may be performed by a wet cleaning process. The second sacrificial spacer 34 may be removed by the pre-cleaning, and the first sacrificial spacer 33 may be conserved on the active region 22.

Referring to FIG. 26, the semiconductor substrate 21 having the trench 35T may be put into an epitaxial process chamber for pre-baking. The pre-baking may be performed in $GeH_4$ and HCl atmosphere. Subsequently, recessed source and drain 35, a capping layer 37, a first spacer 41, an LDD 43, a halo 45, a second spacer 47, a gate metal silicide layer 26S, and a drain metal silicide layer 37S may be formed by a method similar to that described with reference to FIGS. 4 through 15.

Figure 27:
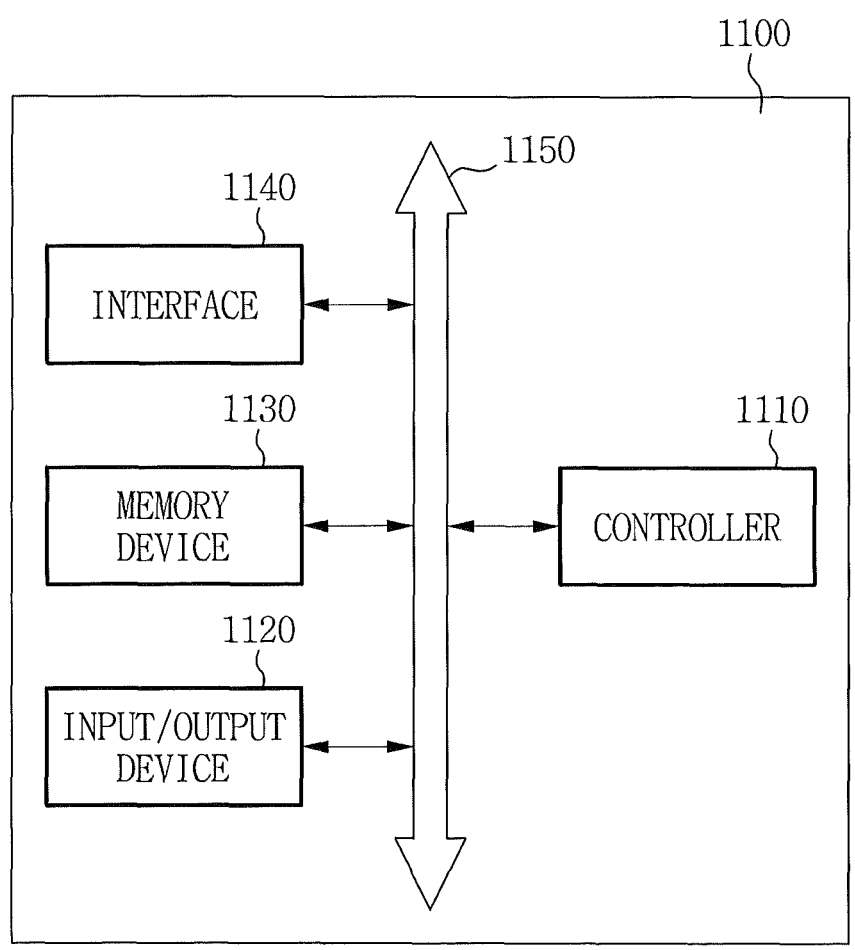
FIG. 27 is a diagram of an electronic system according to some embodiments.

FIG. 27 is a diagram of an electronic system according to some embodiments,

Referring to FIG. 27, an electronic system 1100 according to some embodiments may include a controller 1110, an input/output device 1120, a memory device 1130, an interface 1140, and a bus architecture 1150. The memory device 1130 and/or the controller 1110 may include a semiconductor device similar to those described with reference to FIGS. 1 through 26. The bus architecture 1150 may serve to provide a path through which data between the controller 1110, the input/output device 1120, the memory device 1130, and the interface 1140 are moved.

The controller 1110 may include at least one microprocessor, a digital signal processor, a microcontroller, and at least one of logic devices capable of performing similar functions thereto. The input/output device 1120 may include at least one of a key pad, a keyboard, and a display device. The memory device 1130 may serve to store data and/or commands executed by the controller 1110.

The memory device 1130 may be a volatile memory chip such as a dynamic random access memory (DRAM) or static random access memory (SRAM), a non-volatile memory chip such as a flash memory, a phase change memory, a magnetic random access memory (MRAM), or a resistive random access memory (RRAM), or a combination thereof. For example, the electronic system 1100 may be a solid state disk (SSD).

The interface 1140 may serve to transmit or receive data to or from a communication network. The interface 1140 may be a wired/wireless type. For example, the interface 1140 may include an antenna or a wired/wireless transceiver. The electronic system 1100 may further include an application chipset, a camera image processor (CIS), and an input/output device.

The electronic system 1100 may be realized as a mobile system, a personal computer, an industrial computer, and/or a logic system performing various functions. For example, a mobile system may be one of a personal digital assistant (PDA), a portable computer, a web tablet, a mobile phone, a wireless phone, a laptop computer, a memory card, a digital music system, and a data transceiver system. When the electronic system 1100 is an apparatus capable of performing wireless communication, it may be used in a communication system such as code division multiple access (CDMA), global system for mobile communication (GSM), North American digital cellular (NADC), enhanced-time division multiple access (E-TDMA), wideband code division multiple access (WCDMA), or CDMA2000.

According to some embodiments, a capping layer having a faceted sidewall is provided on recessed source and drain. The faceted sidewall may be formed at an angle selected to provide a sufficient margin to form an LDD and/or a halo. As a result, a semiconductor device having excellent electrical characteristics can be realized.

The above-disclosed subject matter is to be considered illustrative and not restrictive, and the appended claims are intended to cover all such modifications, enhancements, and other embodiments, which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A method of forming a semiconductor device, comprising:
   preparing a semiconductor substrate including a first region and a second region adjacent the first region;
   forming a sacrificial pattern covering the second region and exposing the first region;
   forming a capping layer including a faceted sidewall on the exposed first region using selective epitaxial growth (SEG), the faceted sidewall being separated from the sacrificial pattern;
   removing the sacrificial pattern; and
   implanting impurity ions into the semiconductor substrate using an inclined ion implantation process,
   wherein the faceted sidewall is formed to an angle of intersection of about 50 to about 59 degrees with a main surface of the semiconductor substrate that is substantially coplanar with a surface of the sacrificial pattern, and
   wherein implanting impurity ions comprises forming a lightly doped drain (LDD) and a halo in the second region using the inclined ion implantation process at inclinations selected based on the angle of intersection of the faceted sidewall.

2. The method of claim 1, wherein the angle of intersection comprises about 51 to about 55 degrees.

3. The method of claim 1, wherein forming the capping layer comprises performing a cyclic SEG process at least once, the cyclic SEG process including:
   supplying a silicon source gas, diborane ($B_2H_6$), hydrogen ($H_2$) and hydrogen chloride (HCl) to the semiconductor substrate and forming a semiconductor layer;
   supplying $H_2$ to the semiconductor substrate having the semiconductor layer for purging; and supplying a selective etching gas including $H_2$ and HCl to the semiconductor substrate having the semiconductor layer, wherein a number of iterations of the cyclic SEG process is selected to form the faceted sidewall at a desired angle of intersection with a main surface of the semiconductor substrate that is substantially coplanar with a surface of the sacrificial pattern.

4. The method of claim 3, wherein the cyclic SEG process is repeated in response to a comparison of a thickness of a sub-layer of the capping layer with a threshold thickness.

5. The method of claim 1, wherein forming the capping layer comprises supplying a silicon source gas, diborane ($B_2H_6$), hydrogen ($H_2$), and hydrogen chloride (HCl) to the semiconductor substrate.

6. The method of claim 1, wherein the capping layer is separated from the sacrificial pattern.

7. A method of forming a semiconductor device, comprising:
    forming a gate electrode on a semiconductor substrate;
    forming a sacrificial spacer covering a sidewall of the gate electrode;
    forming a trench in the semiconductor substrate adjacent the gate electrode and the sacrificial spacer;
    forming a recessed source and drain filling the trench;
    forming a capping layer having a faceted sidewall on the recessed source and drain using selective epitaxial growth (SEG), the faceted sidewall being separated from the sacrificial spacer and being between sidewalls of the recessed source and drain;
    removing the sacrificial spacer; and
    implanting impurity ions into the semiconductor substrate,
    wherein the faceted sidewall is formed to an angle of intersection of about 50 to about 59 degrees with a main surface of the semiconductor substrate that is substantially coplanar with a surface of the sacrificial spacer, and
    wherein implanting impurity ions comprises forming a lightly doped drain (LDD) and a halo using an inclined ion implantation process at inclinations selected based on the angle of intersection of the faceted sidewall.

8. The method of claim 7, wherein a surface of the recessed source and drain is formed to extend farther from the semiconductor substrate than a surface of the sacrificial spacer that opposes the semiconductor substrate.

9. The method of claim 7, wherein the recessed source and drain include silicon germanium (SiGe) layers including boron (B).

10. The method of claim 7, wherein the capping layer includes a single crystalline silicon (Si) layer including boron (B).

11. The method of claim 7, wherein forming the capping layer comprises performing a cyclic SEG process at least once, the cyclic SEG process including:
    supplying a silicon source gas, diborane ($B_2H_6$), hydrogen ($H_2$), and hydrogen chloride (HCl) to the semiconductor substrate and forming a semiconductor layer;
    supplying $H_2$ to the semiconductor substrate having the semiconductor layer for purging; and
    supplying a selective etching gas including $H_2$ and HCl to the semiconductor substrate having the semiconductor layer.

12. The method of claim 7, wherein a surface of the recessed source and drain is formed to be substantially coplanar with a surface of the sacrificial spacer.

13. The method of claim 7, wherein the semiconductor substrate includes impurity ions of a first conductivity type and a second conductivity type, and wherein implanting the impurity ions into the semiconductor substrate comprises:
    implanting the ions of the second conductivity type to form a lightly doped drain (LDD) in the semiconductor substrate using the gate electrode as an ion implantation mask; and
    implanting the ions of the first conductivity type to form a halo in the semiconductor substrate using the gate electrode as an ion implantation mask.

14. The method of claim 13, further comprising: before forming the trench, implanting the ions of the second conductivity type to form a high concentration impurity region.

15. The method of claim 7, further comprising forming a metal silicide layer on the capping layer.

16. The method of claim 7, wherein the capping layer has a smaller width than the recessed source and drain, and wherein the width of the capping layer is along a direction that is substantially parallel to a surface of the semiconductor substrate.

17. The method of claim 7, wherein the sacrificial spacer is formed in an "L" shape.

18. A method of forming a semiconductor device, comprising:
    forming a gate electrode on a semiconductor substrate of a first conductivity type;
    forming a sacrificial spacer on a sidewall of the gate electrode;
    forming a trench in the semiconductor substrate adjacent the sacrificial spacer by using the sacrificial spacer as an etch mask;
    forming a semiconductor layer filling the trench, the semiconductor layer comprising a second conductivity type;
    forming a capping layer including a diagonal sidewall on the semiconductor layer using selective epitaxial growth (SEG), the diagonal sidewall being spaced apart from the sacrificial spacer, wherein the diagonal sidewall is formed to an angle of intersection of about 50 to about 59 degrees with a main surface of the semiconductor substrate that is substantially coplanar with a surface of the sacrificial spacer;
    removing the sacrificial spacer;
    implanting ions of the second conductivity type into the semiconductor substrate using the gate electrode as an ion implantation mask to form a lightly doped drain (LDD) region on a sidewall of the semiconductor layer, using an inclined ion implantation process at inclinations selected based on the angle of intersection of the diagonal sidewall; and
    implanting ions of the first conductivity type into the semiconductor substrate using the gate electrode as an ion implantation mask to form a halo region on the sidewall of the semiconductor layer and between the gate electrode and the capping layer, using the inclined ion implantation process at the inclinations selected based on the angle of intersection of the diagonal sidewall.

19. The method of claim 18, further comprising: forming an offset spacer on a sidewall of the gate electrode before forming the LDD and the halo, wherein the offset spacer is spaced apart from the capping layer.

* * * * *